United States Patent [19]

Matsumoto et al.

[11] 4,110,237

[45] * Aug. 29, 1978

[54] COMPOSITIONS CONTAINING A DIAZINE AND A HALOGEN COMPOUND FOR CATALYZING COPPER ETCHING SOLUTIONS

[75] Inventors: Akira Matsumoto; Katsutoshi Itani, both of Fuji, Japan

[73] Assignee: Tokai Denka Kabushiki Kaisha, Tokyo, Japan

[*] Notice: The portion of the term of this patent subsequent to Feb. 3, 1993, has been disclaimed.

[21] Appl. No.: 810,730

[22] Filed: Jun. 28, 1977

Related U.S. Application Data

[60] Continuation of Ser. No. 618,429, Oct. 1, 1975, abandoned, which is a division of Ser. No. 510,535, Sep. 30, 1974, Pat. No. 3,936,332.

[30] Foreign Application Priority Data

Nov. 19, 1973 [JP] Japan .................. 48-129156

[51] Int. Cl.$^2$ ............................................. C09K 13/04
[52] U.S. Cl. .................................. 252/79.4; 156/666
[58] Field of Search ............. 156/666; 252/79.1, 79.4, 252/148, 142, 542, 429 R; 260/250 B, 250 A, 250 R, 250 G, 250 P, 252, 251, 254, 256.4, 250 C, 256

[56] References Cited

U.S. PATENT DOCUMENTS

| | | | |
|---|---|---|---|
| 3,936,332 | 2/1976 | Matsumoto et al. | 156/666 |
| 3,948,703 | 4/1976 | Kushibe | 156/666 |

OTHER PUBLICATIONS

Porter et al., "Silver and Palladium Complexes . . . " *Journal of Heterocyclic Chemistry*, vol. x, pp. 43–46, (Aug. 1973).

Tenhunen, A., "Metal Complexes of Pyrazine" *Chemical Abstracts*, vol. 78, p. 10988, (Jun. 1973).

Gibson et al., "Ferric Complexes . . . Ligand" *Chemical Abstracts*, vol. 75, p. 42919, (Jul. 1971).

Scumb et al., Hydrogen Peroxide, Reinhold Pub. Co., New York, N.Y. 1955, pp. 662–663, 882–888.

*Primary Examiner*—David Klein
*Assistant Examiner*—Jerome W. Massie
*Attorney, Agent, or Firm*—Flynn & Frishauf

[57] ABSTRACT

This invention provides copper and copper alloy etching solutions comprising a mixed aqueous solution of a peroxysulfate with a diazine compound and a halogen compound added as the catalyst. There is also provided a process for etching copper and copper alloys with said etching solutions.

24 Claims, No Drawings

COMPOSITIONS CONTAINING A DIAZINE AND A HALOGEN COMPOUND FOR CATALYZING COPPER ETCHING SOLUTIONS

This is a continuation, of application Ser. No. 618,429, filed Oct. 1, 1975, now abandoned, which, in turn, is a division of application Ser. No. 510,535, filed Sept. 30, 1974, now U.S. Pat. No. 3,936,332.

BACKGROUND OF THE INVENTION

1. Field of the Invention

This invention relates to copper and copper alloy etching solutions and an etching process using said solutions. More particularly, it is concerned with copper and copper alloy etching solutions containing catalysts for greatly increasing the rate of etching.

2. Description of the Prior Art

Etching of copper and copper alloys is widely used in various industrial fields.

Particularly with development of the electronic industry, it has been technologically adopted in the production of printed circuit boards and lead frame of the IC circuit, and thereby acquired a greater importance.

Etching of copper and copper alloys has been performed using ferric chloride, cupric chloride, chromic-sulfuric acid mixtures, peroxysulfates and the like. Among them, use of chromic anhydride-sulfuric acid mixtures produces a waste containing dissolved copper and chromium and use of ferric chloride a waste containing a large amount of metallic copper and iron ions. Simultaneous and complete removal of these metals is so difficult that the process producing such a waste is unsuitable for use owing to the resulting pollution problem.

On the other hand, use of a peroxysulfate solution, which produces a waste containing copper only, is preferable as the etching solution because of the relative ease in removal of the copper. However, as the rate of etching copper and copper alloys is very slow with a persulfate alone, a catalyst should be added in order to achieve a rate of etching approximately equal to the rate usually achieved with ferric chloride. As described in Japanese Patent Publication 16008/1961, mercury salts are usually used as the catalyst. The waste from the etching is then contaminated with mercury ions, which, being very hazardous to living bodies, should be removed. However, as the complete removal of mercury is very difficult, development of substitute catalysts is eagerly desired.

SUMMARY OF THE INVENTION

It is an object of the present invention to provide aqueous, catalyzed peroxysulfate solutions for etching copper and copper alloys which accelerate the etch rate with a lasting catalytic effect and in which inexpensive but non-hazardous and non water-polluting substances are employed.

After extensive investigations of the process for etching copper and copper alloys with an aqueous peroxysulfate solution we have found that addition of one or more diazine compounds and one or more halogen compounds as the catalyst to an aqueous peroxysulfate solution greatly increases the etch rate as well as providing a lasting catalytic effect.

DESCRIPTION OF THE INVENTION

This invention is based upon the unique action exerted in the coexistence of a diazine compound and a halogen compound. The object of the invention will not be realized in the absence of either the diazine or the halogen compounds.

Diazine compounds suitable for use in the invention are compounds having a pyrimidine, pyrazine or pyridazine nucleus such as, for example, pyrimidine, aminopyrimidines, methylpyrimidines, pyrazine, pyrazinecarboxamide, quinoxaline, pyridazine, phthalazine, cinnoline and the like.

As the halogen compounds are used substances liberating halogen in an aqueous solution, which includes, for example, hydrofluoric acid and salts thereof, hydrochloric acid and salts thereof, hydrobromic acid and salts thereof, hydriodic acid and salts thereof, oxides of fluorine, chlorine, bromine and iodine, oxygen-containing acids of chlorine, bromine and iodine and salts thereof, dichloroisocyanuric acid and salts thereof, 1-chlorodiethylether and the like. Copper and copper alloys to which the invention can be applied include copper, brass, bronze, beryllium copper, constantan and the like. The peroxysulfates used for etching these metals are described in Japanese Patent Publications 9463/1964 and 11324/1966; these include ammonium, potassium, sodium and lithium salts of peroxymonosulfuric acid and ammonium, potassium, sodium, barium and lithium salts of peroxydisulfuric acid and the like. Ammonium peroxymonosulfate and peroxydisulfate are particularly preferred for the invention.

Concentration of the peroxysulfate in etching copper and copper alloys according to the invention is from 5% by weight to the solubility limit and preferably from 5% by weight to 25% by weight, and that of the diazine compound is from 50 p.p.m. to the solubility limit and preferably from 100 p.p.m. to 2000 p.p.m. Whereas addition of the compounds in concentrations in excess of 2000 p.p.m. will not produce adverse reactions, it is not economical. Concentration of the halogen compound is from 5 p.p.m. to 2000 p.p.m. and preferably from 10 p.p.m. to 1000 p.p.m.

DESCRIPTION OF PREFERRED EMBODIMENTS

The invention is illustrated by the following examples:

EXAMPLES 1-20

Etching solutions were prepared at concentrations of 250 g./l. of ammonium peroxydisulfate and 50 ml./l. of 75% by weight orthophosphoric acid with a diazine compound and sodium chloride in combination. The etching solution was placed in a small plate-rotary spray etcher, which was then used for etching the copper of a copper laminated board 5 cm. × 5 cm. in size with copper foil 35 $\mu$ in thickness at a spray pressure of 0.5 kg./cm.$^2$ while maintaining the temperature at 40° C. Results are shown in Table I.

Table I

| Example No. | Name and Concentration of Diazine Compound | Concentration (mg./l.) | Concentration of Sodium Chloride p.p.m. (in terms of Cl⁻) | Rate of Etching ($\mu$/min.) |
|---|---|---|---|---|
| 1 | Pyrimidine | 400 | — | 5.3 |
| 2 | " | " | 10 | 52.8 |
| 3 | 5-Methylpyrimidine | " | — | 5.5 |
| 4 | " | " | 10 | 53.8 |
| 5 | 2-Aminopyrimidine | 600 | — | 5.5 |
| 6 | " | " | 10 | 27.6 |
| 7 | Pyrazine | 200 | — | 5.0 |
| 8 | " | " | 10 | 47.9 |
| 9 | " | 400 | — | 6.2 |
| 10 | " | " | 10 | 55.3 |
| 11 | Pyrazinecarboxamide | 600 | — | 5.8 |
| 12 | " | " | 10 | 34.0 |
| 13 | Quinozaline | 200 | — | 4.9 |
| 14 | " | " | 10 | 21.2 |
| 15 | Pyridazine | 800 | — | 3.6 |
| 16 | " | " | 10 | 20.0 |
| 17 | Phthalazine | 200 | — | 4.6 |
| 18 | " | " | 10 | 31.8 |
| 19 | Cinnoline | 200 | — | 5.9 |
| 20 | " | " | 10 | 20.5 |
| Reference Example | | | | |
| (1) | — | — | — | 5.0 |
| (2) | — | — | 10 | 2.7 |

The data in Table I indicate that only the use of a diazine compound and a halogen compound in combination greatly increases the rate of etching.

EXAMPLES 21-30

Etching solutions were prepared at 250 g./l. of ammonium peroxydisulfate, 50 ml./l. of 75% by weight orthophosphoric acid and 400 mg./l. of pyrazine with sodium chloride of varied concentrations added. Etching of copper was performed using the solution in the same way as in Examples 1-20. Results are shown in Table II.

Table II

| Example No. | Concentration of Sodium Chloride p.p.m. (in terms of Cl⁻) | Rate of Etching ($\mu$/min.) |
|---|---|---|
| 21 | 20 | 55.3 |
| 22 | 50 | " |
| 23 | 100 | " |
| 24 | 200 | 53.5 |
| 25 | 400 | " |
| 26 | 600 | 50.0 |
| 27 | 800 | " |
| 28 | 1000 | 38.0 |
| 29 | 2000 | 30.0 |
| 30 | 3000 | 24.1 |

The data in Table II indicate that the presence of chlorine ion at concentrations of 1000 p.p.m. or more decreases the rate of etching.

EXAMPLES 31-34

A solution was prepared at concentrations of 250 g./l. of ammonium peroxydisulfate, 50 ml./l. of 75% by weight orthophosphoric acid and 400 ml./l. of 5-methylpyrimidine, to which were added sodium bromide, potassium iodide, dichloroisocyanuric acid and 1-chlorodiethylether respectively. Etching of copper was made using respectively these solutions in the same way as in Examples 1-20.

Table III

| Example No. | Name of the Halogen Compound | Concentration (in terms of halogen) p.p.m. | Rate of Etching ($\mu$/min.) |
|---|---|---|---|
| 31 | Sodium bromide | 50 | 52.9 |
| 32 | Potassium iodide | 50 | 50.5 |
| 33 | Dichloroisocyanuric acid | 50 | 48.7 |
| 34 | 1-chlorodiethylether | 50 | 52.5 |

EXAMPLE 35

A solution was prepared of ammonium peroxymonosulfate at 100 g./l., sulfuric acid at 50 g./l., phthalazine at 400 mg./l. and sodium chloride at 10 p.p.m. in terms of Cl⁻. Etching of copper was performed using the solution in the same way as in Examples 1-20. The rate of the copper etching was 38.5 $\mu$/min. As a comparative example, etching of copper was performed in the same way as above, except that a solution of ammonium peroxymonosulfate at 100 g./l. and sulfuric acid at 50 g./l. was used with no catalyst added. The rate of the copper etching was 6.3 $\mu$/min.

EXAMPLE 36

A solution was prepared of ammonium peroxymonosulfate at 250 g./l., pyrazine at 400 mg./l. and sodium chloride at 10 p.p.m. in terms of Cl⁻. pH of the solution was 3.2. Etching of copper was made using the solution in the same way as in Examples 1-20. Rate of the copper etching was 53.9 $\mu$/min.

EXAMPLE 37

A solution was prepared of ammonium peroxydisulfate at 250 g./l., pyrazine at 400 mg./l. and sodium chloride at 10 p.p.m. in terms of Cl⁻, pH being adjusted with ammonium carbonate to 5.0. Etching of copper was made in the same way as in Examples 1-20. Rate of the copper etching was 55.3 $\mu$/min.

What is claimed is:
1. A composition for catalyzing peroxysulfate solutions for etching copper and copper alloys comprising from 50 to 2000 parts by weight of a diazine and from 5 to 2000 parts by weight of a halogen compound which liberates halogen in an aqueous solution, said diazine being selected from the group consisting of pyrimidine, aminopyrimidine, methylpyrimidine, pyrazine, pyrazinecarboxamide, quinoxaline, pyridazine, phthala- zine and cinnoline, and said halogen compound is a member selected from the group consisting of an alkali metal salt of a halogen acid, dichloroisocyanuric acid and salts thereof, and 1-chlorodiethylether.

2. The composition of claim 1, containing from 100 to 2000 parts by weight of said diazine and from 10 to 1000 parts by weight of said halogen compound.

3. The composition of claim 1, wherein the diazine is pyrazine.

4. The composition of claim 1, wherein the diazine is 5-methylpyrimidine.

5. The composition of claim 1, wherein the diazine is phthalazine.

6. The composition of claim 1, wherein the diazine is pyrimidine.

7. A composition comprising from 50 to 2000 parts by weight of a diazine and from 5 to 2000 parts by weight of a sodium or potassium salt of a halogen acid, said diazine being selected from the group consisting of pyrimidine, aminopyrimidine, methylpyrimidine, pyrazine, pyrazinecarboxamide, quinoxaline, pyridazine, phthalazine and cinnoline.

8. A composition of claim 7, wherein the salt of a halogen acid is sodium cloride.

9. A composition comprising from 50 to 2000 parts by weight of a diazine and from 5 to 2000 parts by weight of dichloroisocyanuric acid, said diazine being selected from the group consisting of pyrimidine, aminopyrimidine, methylpyrimidine, pyrazine, pyrazinecarboxamide, quinoxaline, pyridazine, phthalazine and cinnoline.

10. A composition comprising from 50 to 2000 parts by weight of a diazine and from 5 to 2000 parts by weight of 1-chlorodiethylether, said diazine being selected from the group consisting of pyrimidine, aminopyrimidine, methylpyrimidine, pyrazine, pyrazinecarboxamide, quinoxaline, pyridazine, phthalazine and cinnoline.

11. A composition for catalyzing peroxysulfate solutions for etching copper and copper alloys consisting essentially of from 50 to 2000 parts by weight of a diazine and from 5 to 2000 parts by weight of a halogen compound which liberates halogen in an aqueous solution, said diazine being selected from the group consisting of pyrimidine, aminopyrimidine, methylpyrimidine, pyrazine, pyrazinecarboxamide, quinoxaline, pyridazine, phthalazine and cinnoline, and said halogen compound is a member selected from the group consisting of an alkali metal salt of a halogen acid, dichloroisocyanuric acid and salts thereof, and 1-chlorodiethylether.

12. A composition comprising a peroxysulfate, from 50 to 2000 parts by weight of a diazine and from 5 to 2000 parts by weight of a halogen compound which liberates halogen in an aqueous solution, said diazine being selected from the group consisting of pyrimidine, aminopyrimidine, methylpyrimidine, pyrazine, pyrazinecarboxamide, quinoxaline, pyridazine, phthalazine and cinnoline, and said halogen compound is a member selected from the group consisting of an alkali metal salt of a halogen acid, dichloroisocyanuric acid and salts thereof, and 1-chlorodiethylether.

13. The composition of claim 12, wherein the peroxysulfate is selected from the group consisting of an ammonium, potassium, sodium and lithium salt of peroxymonosulfuric acid and an ammonium, potassium, sodium, barium and lithium salt of peroxydisulfuric acid.

14. The composition of claim 12, wherein the peroxysulfate is ammonium peroxymonosulfate.

15. The composition of claim 12, wherein the peroxysulfate is ammonium peroxydisulfate.

16. An aqueous solution of claim 12, wherein the solution contains from 5 percent by weight to the solubility limit of said peroxysulfate.

17. An aqueous solution of claim 12, wherein the solution contains from 5 percent by weight to 25 percent by weight of said peroxysulfate.

18. The composition of claim 12, wherein the diazine is pyrazine.

19. The composition of claim 12, wherein the diazine is 5-methylpyrimidine.

20. The composition of claim 12, wherein the diazine is phthalazine.

21. The composition of claim 12, wherein the diazine is pyrimidine.

22. The composition of claim 12, wherein the halogen compound is sodium chloride.

23. The composition of claim 12, wherein the halogen compound is dichloroisocyanuric acid.

24. The composition of claim 12, wherein the halogen compound is 1-chlorodiethylether.

* * * * *